US008802478B2

(12) United States Patent
Kato et al.

(10) Patent No.: US 8,802,478 B2
(45) Date of Patent: Aug. 12, 2014

(54) METHOD FOR MANUFACTURING SEMICONDUCTOR DEVICE AND METHOD FOR MANUFACTURING SOLID STATE IMAGE SENSOR USING MULTIPLE INSULATION FILMS

(71) Applicant: Canon Kabushiki Kaisha, Tokyo (JP)

(72) Inventors: Aiko Kato, Machida (JP); Takehito Okabe, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/626,525

(22) Filed: Sep. 25, 2012

(65) Prior Publication Data

US 2013/0089947 A1    Apr. 11, 2013

(30) Foreign Application Priority Data

Oct. 7, 2011 (JP) ................................. 2011-223456

(51) Int. Cl.
| | | |
|---|---|---|
| *H01L 31/18* | (2006.01) | |
| *H01L 27/146* | (2006.01) | |
| *H01L 21/311* | (2006.01) | |
| *H01L 21/316* | (2006.01) | |
| *H01L 21/318* | (2006.01) | |
| *H01L 21/768* | (2006.01) | |
| *H01L 21/02* | (2006.01) | |
| *H01L 23/48* | (2006.01) | |
| *H01L 21/285* | (2006.01) | |

(52) U.S. Cl.
CPC .......... *H01L 21/76802* (2013.01); *H01L 31/18* (2013.01); *H01L 21/28518* (2013.01); *H01L 21/76897* (2013.01); *H01L 21/31111* (2013.01); *H01L 21/02164* (2013.01); *H01L 21/0217* (2013.01); *H01L 27/14683* (2013.01); *H01L 23/481* (2013.01)

USPC ................. 438/59; 438/98; 438/597; 438/73; 257/E31.001

(58) Field of Classification Search
CPC .............. H01L 21/31111; H01L 31/18; H01L 21/28518; H01L 21/76897; H01L 21/316; H01L 21/318
USPC ................. 438/98, 59, 597, 72; 257/E31.001
See application file for complete search history.

(56) References Cited

U.S. PATENT DOCUMENTS

| | | | |
|---|---|---|---|
| 5,763,910 | A | 6/1998 | Ema |
| 5,874,756 | A | 2/1999 | Ema et al. |

(Continued)

FOREIGN PATENT DOCUMENTS

| | | |
|---|---|---|
| JP | 2002-237525 A | 8/2002 |
| JP | 2007-165864 A | 6/2007 |

(Continued)

*Primary Examiner* — Colleen Matthews
*Assistant Examiner* — Regan J Rundio
(74) *Attorney, Agent, or Firm* — Fitzpatrick, Cella, Harper & Scinto

(57) ABSTRACT

Manufacturing a semiconductor device includes preparing a structure including a semiconductor substrate having a first region and a second region, a first insulating film arranged on the first region, a second insulating film arranged on the first insulating film, a third insulating film arranged on the second insulating film, a fourth insulating film arranged on the second region, a fifth insulating film arranged on the fourth insulating film, and a sixth insulating film arranged on the fifth insulating film, etching the second insulating film and the first insulating film under different etching conditions after etching the third insulating film, and continuously etching the fifth insulating film and the fourth insulating film under the same etching conditions after etching the sixth insulating film.

12 Claims, 18 Drawing Sheets

(56) References Cited

U.S. PATENT DOCUMENTS

| | | |
|---|---|---|
| 5,972,757 A | 10/1999 | Ema |
| 6,214,658 B1 * | 4/2001 | Niuya ............................ 438/233 |
| 6,335,552 B1 | 1/2002 | Mitani |
| 6,395,599 B1 | 5/2002 | Ema et al. |
| 6,730,574 B2 | 5/2004 | Ema et al. |
| 6,744,091 B1 | 6/2004 | Ema et al. |
| 6,791,187 B2 | 9/2004 | Ema et al. |
| 6,992,347 B2 | 1/2006 | Ema et al. |
| 7,795,147 B2 | 9/2010 | Ema et al. |
| 7,993,951 B2 | 8/2011 | Okabe et al. |
| 2002/0003248 A1 | 1/2002 | Ema et al. |
| 2007/0108546 A1 | 5/2007 | Furuichi |
| 2008/0009135 A1 | 1/2008 | Ema et al. |
| 2008/0057717 A1 * | 3/2008 | Owada et al. ................. 438/694 |
| 2010/0224951 A1 * | 9/2010 | Nishimura .................... 257/459 |
| 2010/0283092 A1 | 11/2010 | Ema et al. |
| 2010/0285653 A1 | 11/2010 | Ema et al. |
| 2010/0330723 A1 * | 12/2010 | Okabe et al. .................... 438/59 |
| 2011/0244627 A1 | 10/2011 | Okabe et al. |
| 2011/0291217 A1 | 12/2011 | Furuichi |

FOREIGN PATENT DOCUMENTS

| | | |
|---|---|---|
| JP | 2010-040634 A | 2/2010 |
| JP | 2010-212365 A | 9/2010 |
| JP | 2011-029604 A | 2/2011 |

* cited by examiner

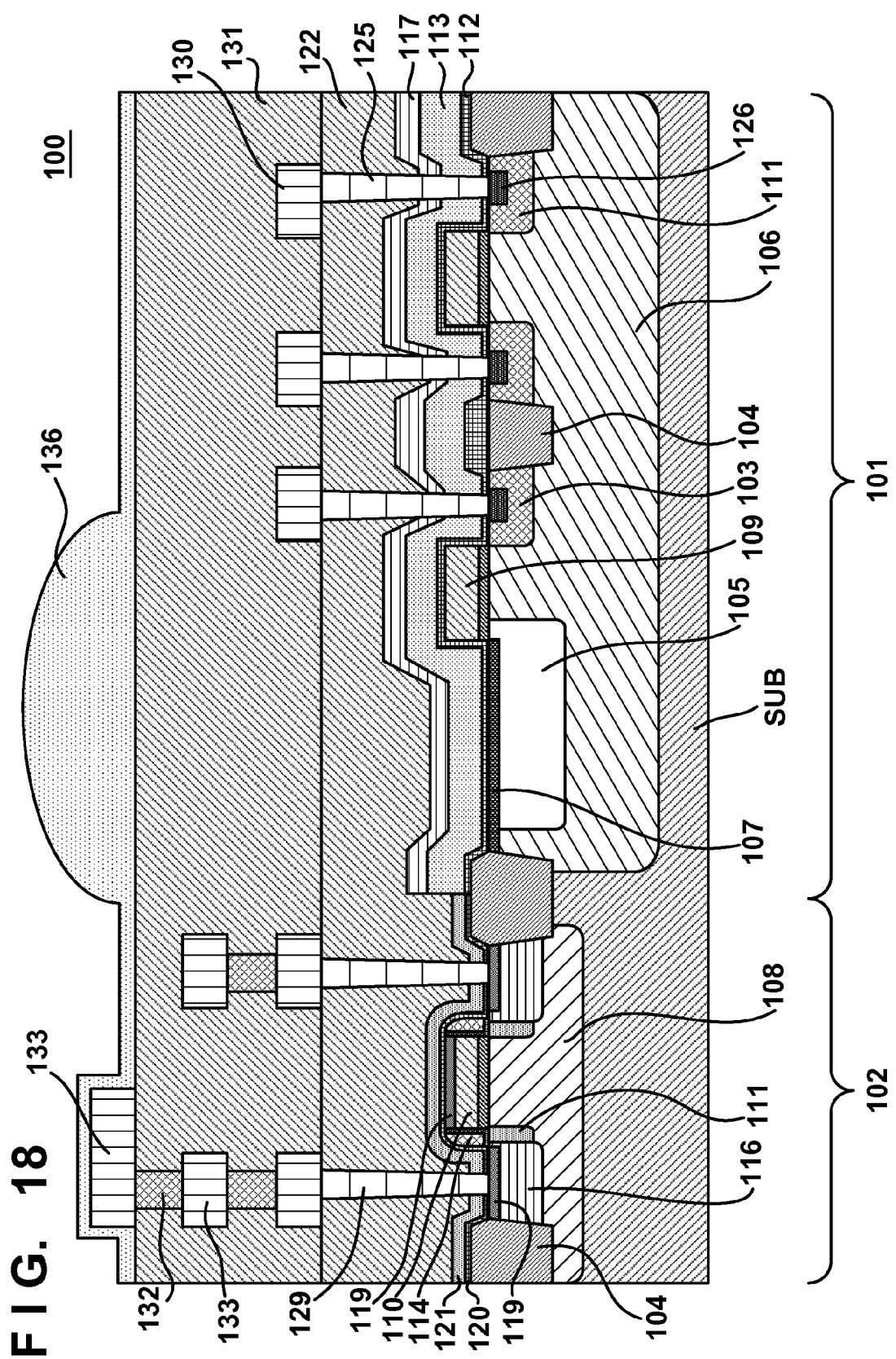

METHOD FOR MANUFACTURING SEMICONDUCTOR DEVICE AND METHOD FOR MANUFACTURING SOLID STATE IMAGE SENSOR USING MULTIPLE INSULATION FILMS

BACKGROUND OF THE INVENTION

1. Field of the Invention

The present invention relates to a method for manufacturing a semiconductor device.

2. Description of the Related Art

A solid state image sensor is one of typical semiconductor devices which have a strict leakage current requirement. With the advance of solid state image sensors, high-quality, inexpensive digital cameras and digital video cameras have become very popular. Each solid state image sensor includes a pixel area and a peripheral area. The pixel area includes a plurality of pixels. Each pixel includes, for example, a photoelectric converter (photodiode), a transfer transistor, and an amplification transistor. The amplification transistor may sometimes be shared by a plurality of pixels. The peripheral area includes a MOS transistor. The peripheral area processes a signal output from each pixel of the pixel area and controls the pixels in the pixel area. The circuits in the pixel area and the peripheral area can be manufactured by the common steps in the CMOS manufacturing process.

A semiconductor compound layer (silicide) of a high melting point metal is selectively formed on the source, drain, and gate electrodes of the MOS transistor of the peripheral area, thereby increasing the operation speed of the MOS transistor. On the other hand, forming a silicide layer on the photoelectric converter of the pixel area increases the leakage current of the photoelectric converter, thereby degrading the photoelectric conversion characteristics.

Japanese Patent Laid-Open No. 2011-29604 discloses suppression of the leakage current of a photoelectric converter by forming a silicide layer only in the peripheral area out of the pixel area and peripheral area. Japanese Patent Laid-Open No. 2007-165864 discloses a method of forming an interlayer insulating film on a silicon nitride film formed on a silicon oxide film and forming a contact hole extending through the silicon oxide film, the silicon nitride film, and the interlayer insulating film. According to this method, an opening is formed in the interlayer insulating film using the silicon nitride film as an etching stopper, and the silicon nitride film and the silicon oxide film are etched through the opening.

As disclosed in Japanese Patent Laid-Open No. 2007-165864, the method of forming the silicon oxide film on a semiconductor substrate, forming the silicon nitride film on the silicon oxide film, forming the interlayer insulating film (silicon oxide film) on the silicon nitride film, and then forming the contact hole is known. When continuously etching the silicon nitride film and the silicon oxide film under the silicon nitride film through the opening formed in the interlayer insulating film under the same conditions, an etching selectivity to the semiconductor substrate cannot be kept sufficiently high. That is, etching conditions suitable for both the silicon nitride film and the silicon oxide film are insufficient for the etching selectivity to the semiconductor substrate. For this reason, the surface of the semiconductor substrate may be excessively etched. This may cause degradation of the performance of semiconductor devices, such as an increase in leakage current. The silicon nitride film and the silicon oxide film under the silicon nitride film may be etched under different etching conditions to increase the etching selectivity of the silicon oxide film to the semiconductor substrate. However, in this case, it takes time to change the etching conditions, thereby decreasing the throughput.

SUMMARY OF THE INVENTION

The present invention provides a method for suitably manufacturing a high-performance semiconductor device at a high throughput.

One of aspects of the present invention provides a method for manufacturing a semiconductor device, the method comprising: preparing a structure including a semiconductor substrate having a first region and a second region, a first insulating film arranged on the first region of the semiconductor substrate, a second insulating film arranged on the first insulating film, a third insulating film arranged on the second insulating film, a fourth insulating film arranged on the second region of the semiconductor substrate, a fifth insulating film arranged on the fourth insulating film, and a sixth insulating film arranged on the fifth insulating film; forming first contact holes extending through the first insulating film, the second insulating film, and the third insulating film; and forming second contact holes extending through the fourth insulating film, the fifth insulating film, and the sixth insulating film, wherein the first insulating film, the third insulating film, the fourth insulating film, and the sixth insulating film have a first composition, and the second insulating film and the fifth insulating film have a second composition different from the first composition, the forming the first contact holes comprises etching the second insulating film and the first insulating film under different etching conditions after etching the third insulating film using the second insulating film as an etching stopper, and the forming the second contact holes comprises continuously etching the fifth insulating film and the fourth insulating film under the same etching conditions after etching the sixth insulating film using the fifth insulating film as an etching stopper.

Further features of the present invention will become apparent from the following description of exemplary embodiments with reference to the attached drawings.

BRIEF DESCRIPTION OF THE DRAWINGS

FIG. 18 is a sectional view exemplifying the method for manufacturing the solid state image sensor as the example of the semiconductor device.

DESCRIPTION OF THE EMBODIMENTS

A semiconductor device according to the present invention includes a first region and a second region. When applying the semiconductor device of the present invention to a solid state image sensor, the first region typically includes a pixel area having pixels each including a photoelectric converter, and the second region typically includes a peripheral area for reading out signals from pixels. Alternatively, when the semiconductor device according to the present invention includes a digital signal processing circuit and an analog signal processing circuit, the first region is typically a region in which the analog signal processing circuit is arranged, and the second region is typically a region in which the digital signal processing circuit is arranged. The first region has a strict requirement for the characteristics of an element such as a transistor. The second region can have a less strict requirement for the characteristics of an element such as a transistor. Alternatively, the first region can be a region having no silicide layer or metal layer, and the second layer can be a region having a silicide layer or metal layer. An example of a metal layer is a light-shielding metal layer for, for example, a solid state image sensor. The second region can be a peripheral area including a digital signal processing circuit having a silicide layer. Alternatively, the second region can be a charge holding unit having a light-shielding metal layer on the upper portion in the pixel. The charge holding unit can be used for an electronic shutter function or a dynamic range widening function. The first and second regions can arbitrarily be set in accordance with the requirements.

Figure 1:
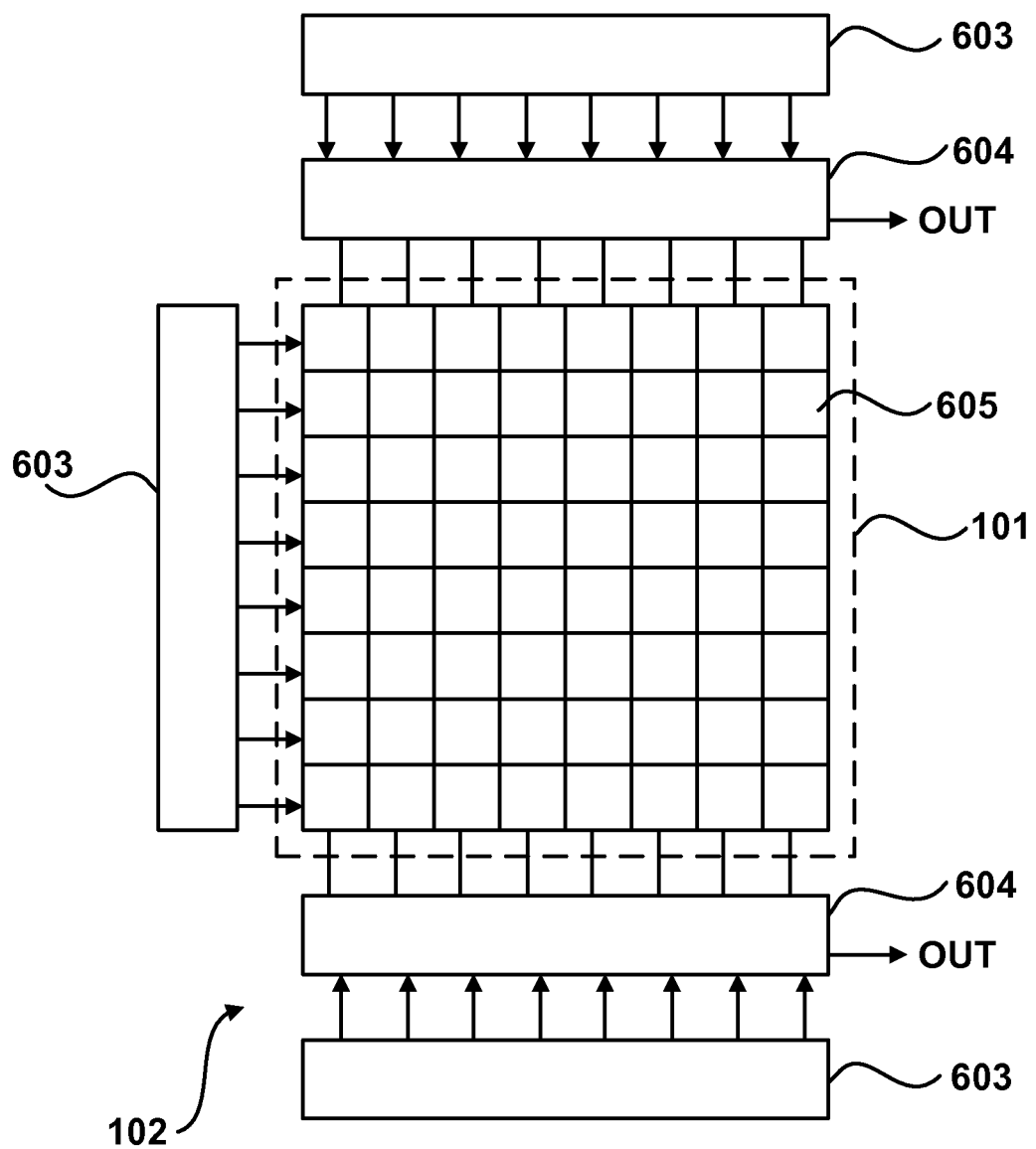
FIG. 1 is a view showing the arrangement of a solid state image sensor as an example of a semiconductor device.

A method for manufacturing a solid state image sensor 100 will be exemplified as one embodiment of a method for manufacturing a semiconductor device according to the present invention. The schematic arrangement of the solid state image sensor 100 will be described with reference to FIG. 1. The solid state image sensor 100 includes, as a first region, a pixel area 101 having pixels 605, each including a photoelectric converter, and, as a second region, a peripheral area 102 for reading out a signal from each pixel 605 of the pixel area 601. The peripheral area 102 is an area other than the pixel area 101. The plurality of pixels are typically arrayed in the pixel area 101 so as to form a plurality of rows and a plurality of columns. The peripheral area 102 includes scanning circuits 603 for selecting each pixel 605 in the pixel area 101, and a processing circuit (read-out circuit) 604 for processing a signal from the selected pixel 605. In the following example, no silicide layer (high melting point metal compound layer) is formed in the pixel area 101, while a silicide layer (high melting point metal compound layer) is formed in the peripheral area 102.

Figure 2:
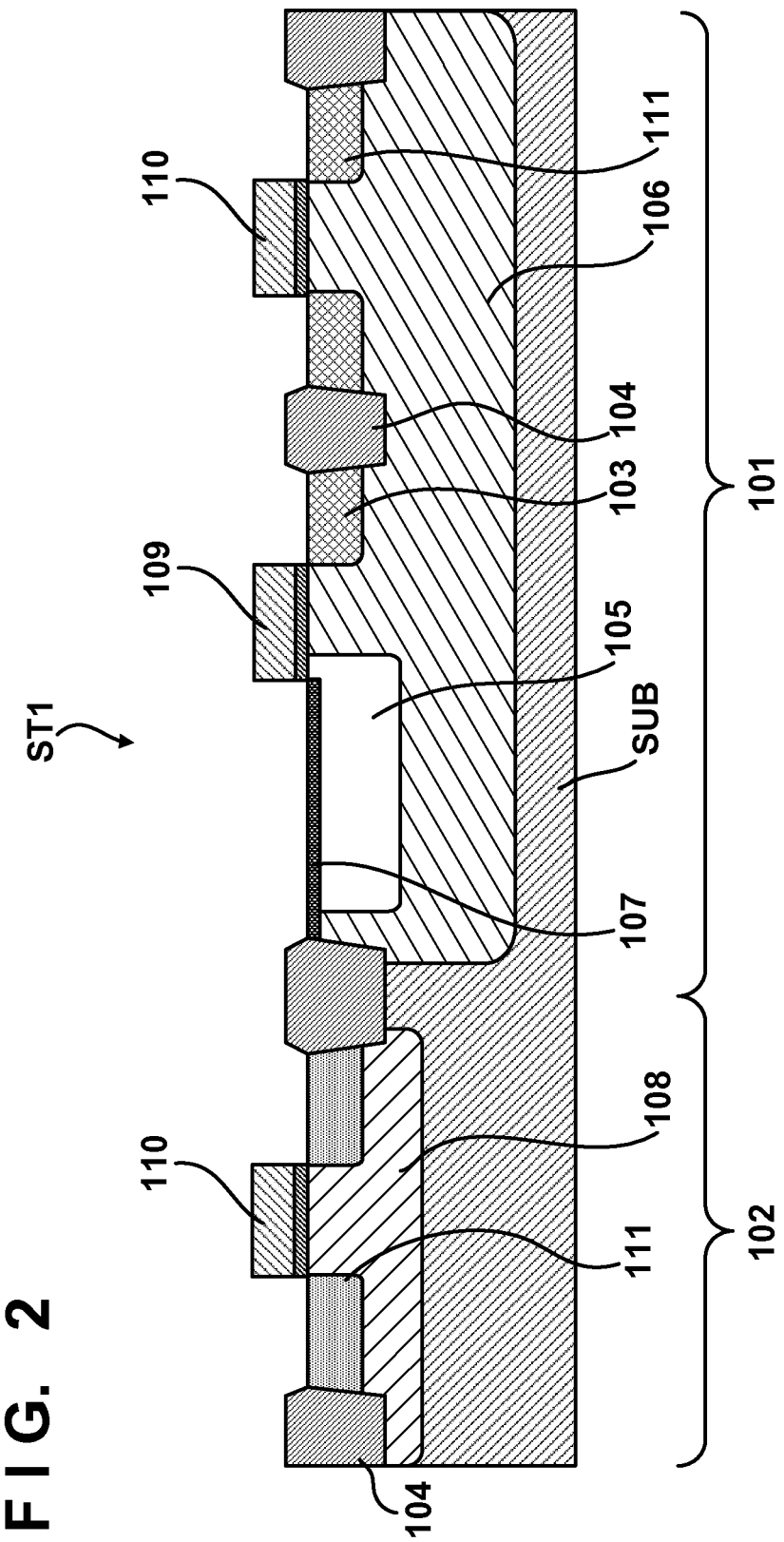
FIG. 2 is a sectional view exemplifying a method for manufacturing a solid state image sensor as an example of the semiconductor device.

A method for manufacturing the solid state image sensor 100 will now be described with reference to FIGS. 2 to 18. For the sake of descriptive simplicity, members before processing and members after processing are denoted by the same reference numerals. First of all, a structure ST1 exemplified in FIG. 2 is prepared. The structure ST1 includes a semiconductor substrate SUB having the pixel area 101 as the first region and the peripheral area 102 as the second region. Note that for the sake of illustrative simplicity, part of the pixel area 101 and part of the peripheral area 102 are illustrated in FIGS. 2 to 18. The elements of the pixel area 101 and the elements of the peripheral area 102 can be formed on the single semiconductor substrate SUB by the CMOS manufacturing process. In order to provide a practical example, electrons are used as signal charges. However, positive holes can be used as the signal charges.

The semiconductor substrate SUB can be a single-crystal silicon substrate made of, for example, an n-type semiconductor region. In the semiconductor substrate SUB, elements (for example, photoelectric converters and transistors) can be isolated from each other by an element isolation region 104. A pixel area well 106 made of a p-type impurity region is arranged in the pixel area 101. A charge accumulation region 105 made of an n-type impurity region is arranged in the pixel area well 106. A surface p-type semiconductor layer 107 is arranged on the charge accumulation region 105. The pixel area well 106, the charge accumulation region 105, and the surface p-type semiconductor layer 107 form an embedded photodiode serving as a photoelectric converter.

A floating diffusion 103 made of an n-type impurity region is arranged in the pixel area well 106. A gate electrode 109 which forms a channel between the charge accumulation region 105 and the floating diffusion 103 is arranged above the region between the charge accumulation region 105 and the floating diffusion 103. The gate electrode 109, the charge accumulation region 105, and the floating diffusion 103 form a MOS transistor. This MOS transistor can be understood as a transfer MOS transistor.

Diffusion regions (impurity regions) 111 which form source and drain regions of the n-type MOS transistor together with the gate electrode 110 are arranged in the pixel area well 106. The depth, impurity concentration, and the like of the pixel area well 106 are determined in accordance with the required photodiode characteristics. The semiconductor substrate SUB is not limited to a single-crystal silicon substrate, but may be any other substrate or a semiconductor substrate having an epitaxial layer.

A peripheral area well 108 made of a p-type impurity region is arranged in the peripheral area 102. Although not shown, an n-type well region in which a p-type MOS transistor is formed is also arranged in the peripheral area 102 in addition to the p-type well region. The MOS transistor arranged in the peripheral area 102 typically has an LDD (Lightly Doped Drain) structure; that is, it includes diffusion regions 116 and diffusion regions 111 having an impurity concentration lower than that of the diffusion regions 116, as shown in FIG. 18. The MOS transistor arranged in the peripheral area 102 can have an LDD-structure forming side spacer 114 on the side surface of the gate electrode.

Examples of the MOS transistor arranged in the pixel area 101 are an amplification transistor, a reset transistor, and a selection transistor in addition to the MOS transistor for transferring charges as described above. Other examples are a MOS transistor for transferring charges to a capacitor for holding charges and a MOS transistor connected to an adjacent photoelectric converter. Examples of the transistors arranged in the peripheral area 102 are transistors which form the scanning circuits 603 and the processing circuit 604.

Figure 3:
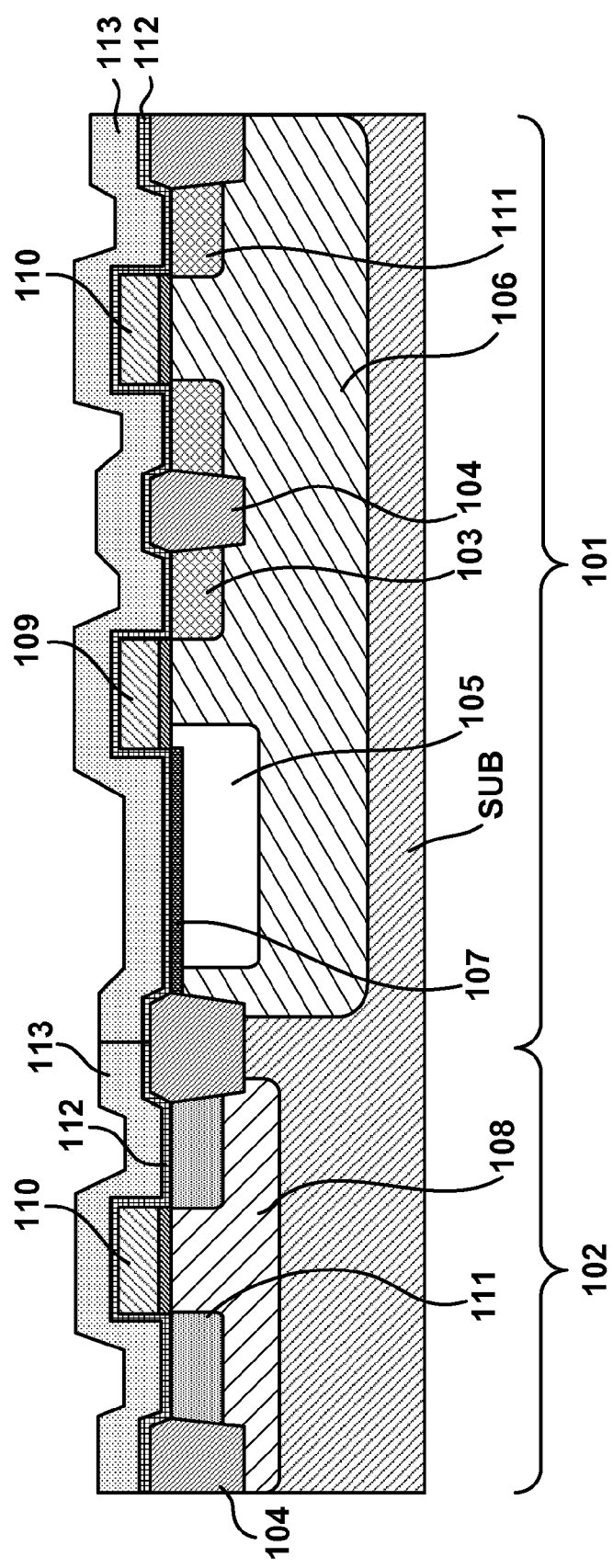
FIG. 3 is a sectional view exemplifying the method for manufacturing the solid state image sensor as the example of the semiconductor device.

As shown in FIG. 3, an insulating film (first insulating film) 112 made of a silicon oxide film is formed in both the pixel area 101 and the peripheral area 102. An insulating film (second insulating film) 113 made of a silicon nitride film is formed on the insulating film 112. The insulating film 112 is effective in relaxing the stress generated by the insulating film 113. The insulating film 113 is used as an etching stopper when forming a contact hole in the pixel area 101.

Figure 4:
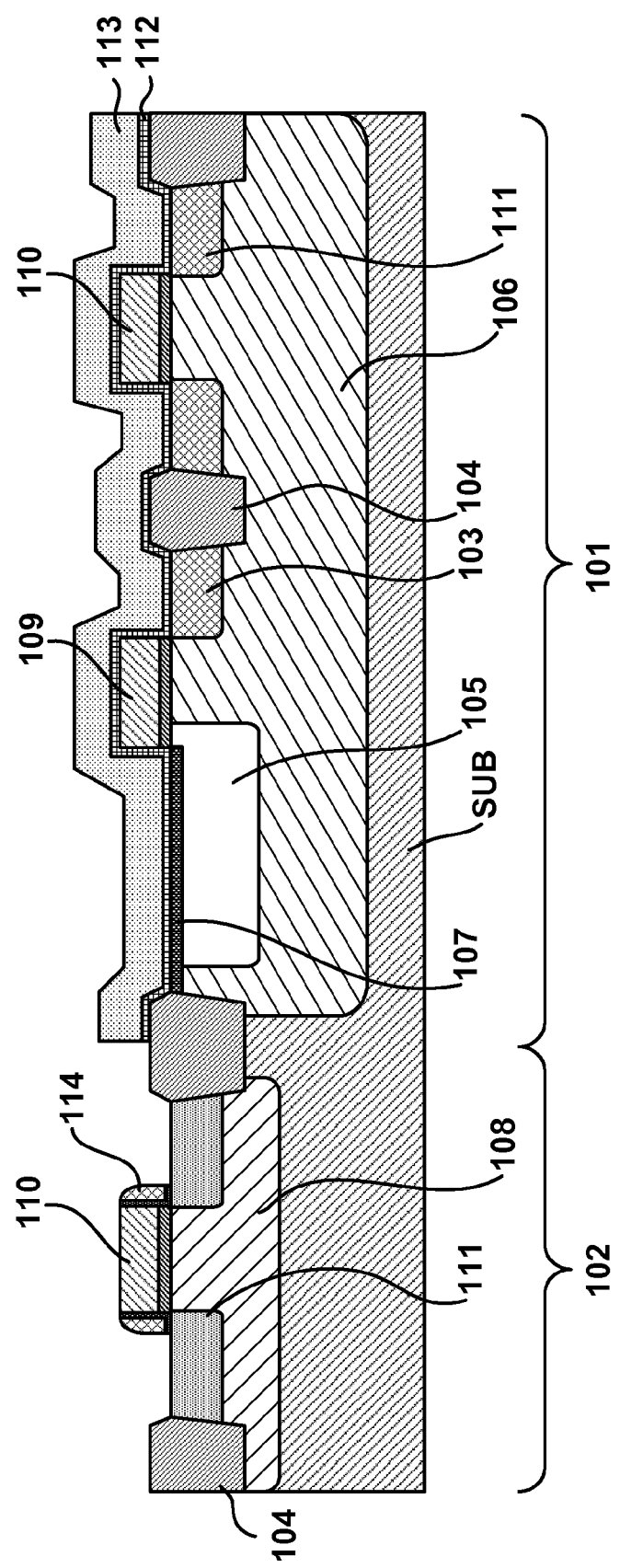
FIG. 4 is a sectional view exemplifying the method for manufacturing the solid state image sensor as the example of the semiconductor device.

A photoresist mask is formed to expose the insulating film 113 of the peripheral area 102 and cover the insulating film 113 of the pixel area 101. The insulating films 113 and 112 of the peripheral area 102 are dry-etched using the photoresist mask as an etching mask, as shown in FIG. 4. In the peripheral area 102, while a side spacer 114 made of the insulating films 113 and 112 is left on the side surface of the gate electrode 110, the insulating films 113 and 112 in the remaining part are removed. On the other hand, the insulating films 113 and 112 are left in the pixel area 101.

Figure 5:
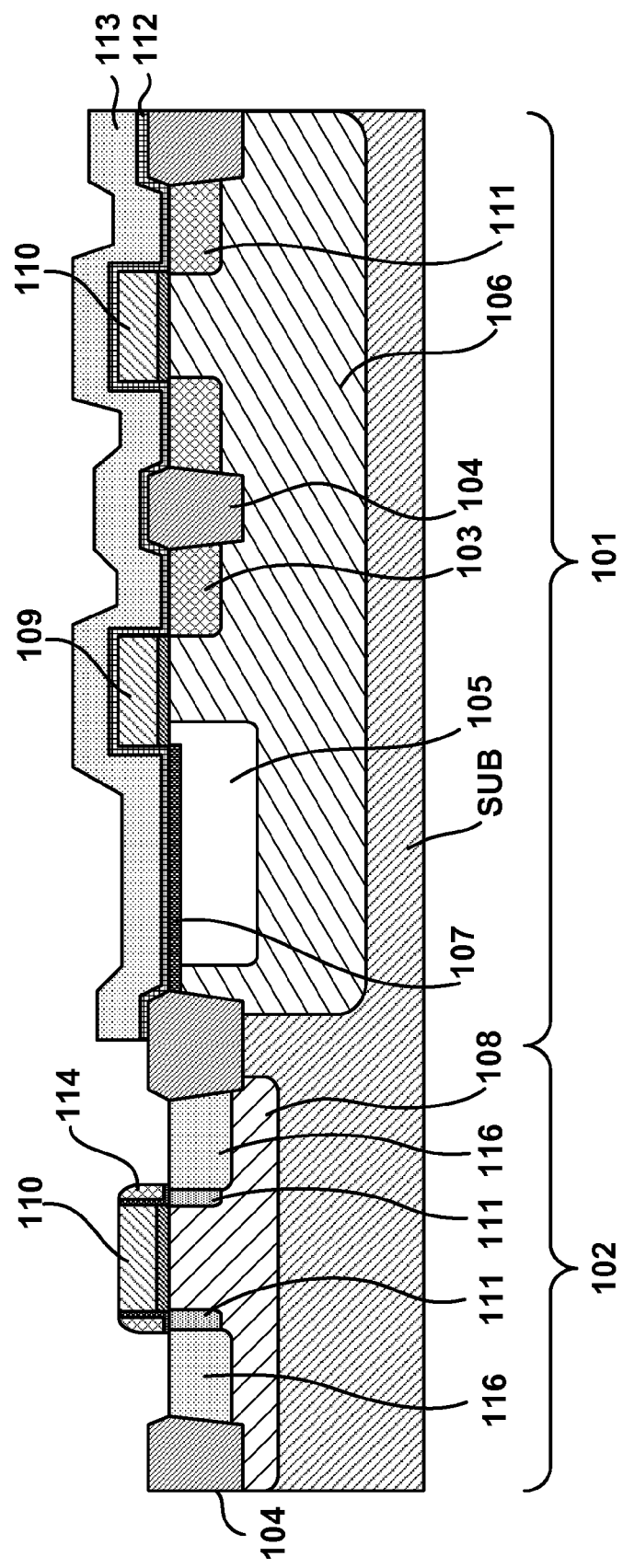
FIG. 5 is a sectional view exemplifying the method for manufacturing the solid state image sensor as the example of the semiconductor device.

As shown in FIG. 5, an n-type impurity is doped in the semiconductor substrate SUB. In this case, the n-type impurity is doped in a larger amount in the region outside the side spacer 114 out of the diffusion region 111 than in the remaining region. This makes it possible to form source and drain regions of the LDD structure which has diffusion regions 116 which have a higher impurity concentration than that of the diffusion regions 111. On the other hand, since the pixel area 101 is covered with the insulating film 113, no LDD structure is formed in the pixel area 101.

Figure 6:
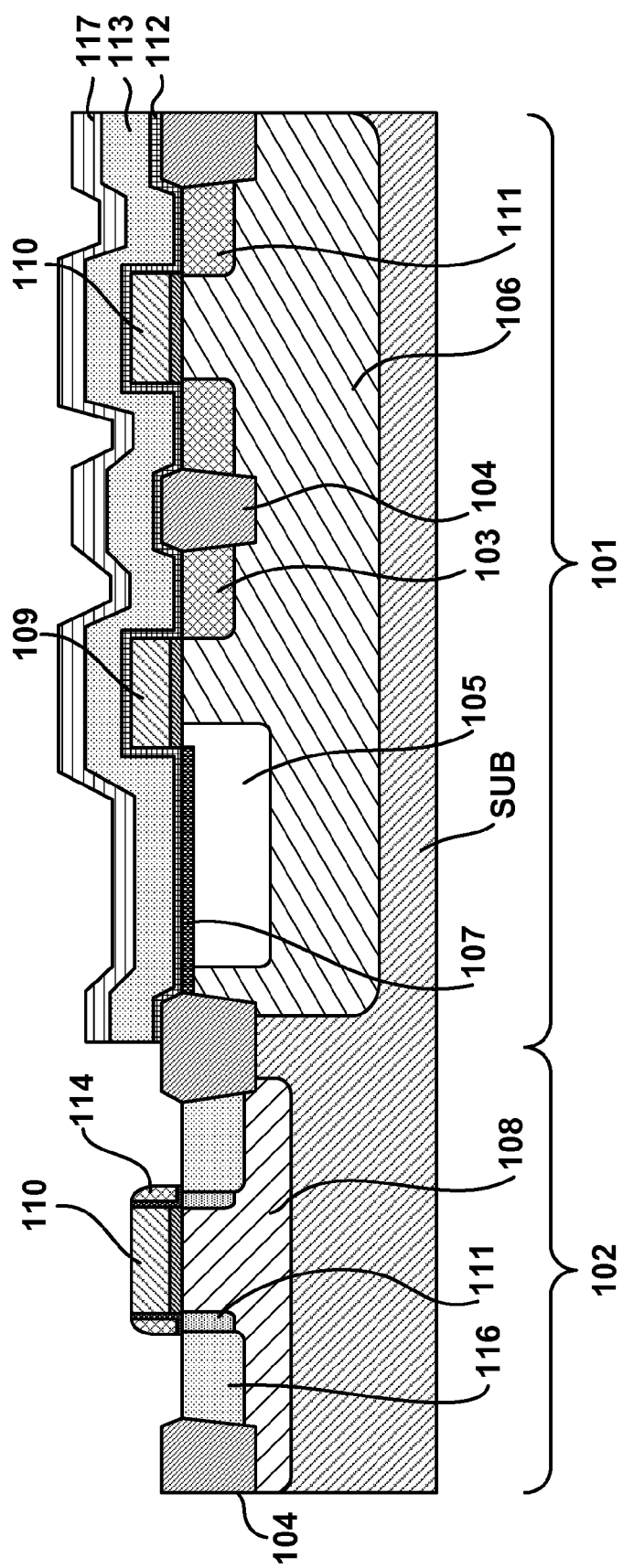
FIG. 6 is a sectional view exemplifying the method for manufacturing the solid state image sensor as the example of the semiconductor device.

An insulating film such as a silicon nitride film, a silicon oxide film, or a silicon oxynitride film is formed on both the pixel area 101 and the peripheral area 102 by CVD or PVD. The insulating film of the peripheral area 102 is selectively removed while the insulating film is left in the pixel area 101, thereby forming a blocking layer 117, as shown in FIG. 6. The blocking layer 117 is left to cover a portion where a silicide layer is not formed later, in addition to the pixel area 101. The portion where the silicide layer is not formed in addition to the pixel area 101 indicates, for example, resistive elements of the peripheral area 102. A silicide layer may be formed in part of the pixel area 101.

Figure 7:
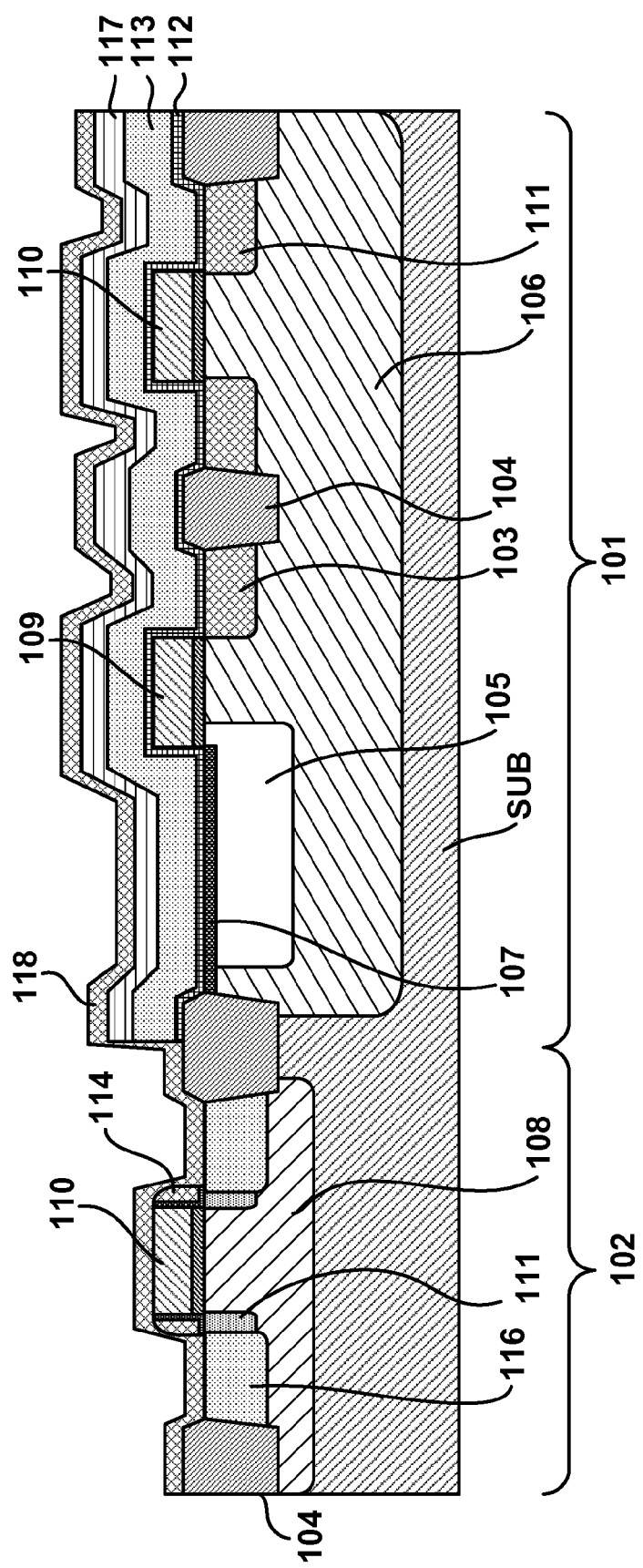
FIG. 7 is a sectional view exemplifying the method for manufacturing the solid state image sensor as the example of the semiconductor device.

As shown in FIG. 7, a stacked film 118 made of cobalt as a high melting point metal and titanium nitride serving as antioxidation film of the high melting point metal is formed on both the pixel area 101 and the peripheral area 102 by CVD or sputtering. Examples of the high melting point metal are titanium, nickel, tungsten, molybdenum, tantalum, chromium, palladium, and platinum. Examples of the antioxidation film of the high melting point metal are nickel and titanium in addition to titanium nitride.

Figure 8:
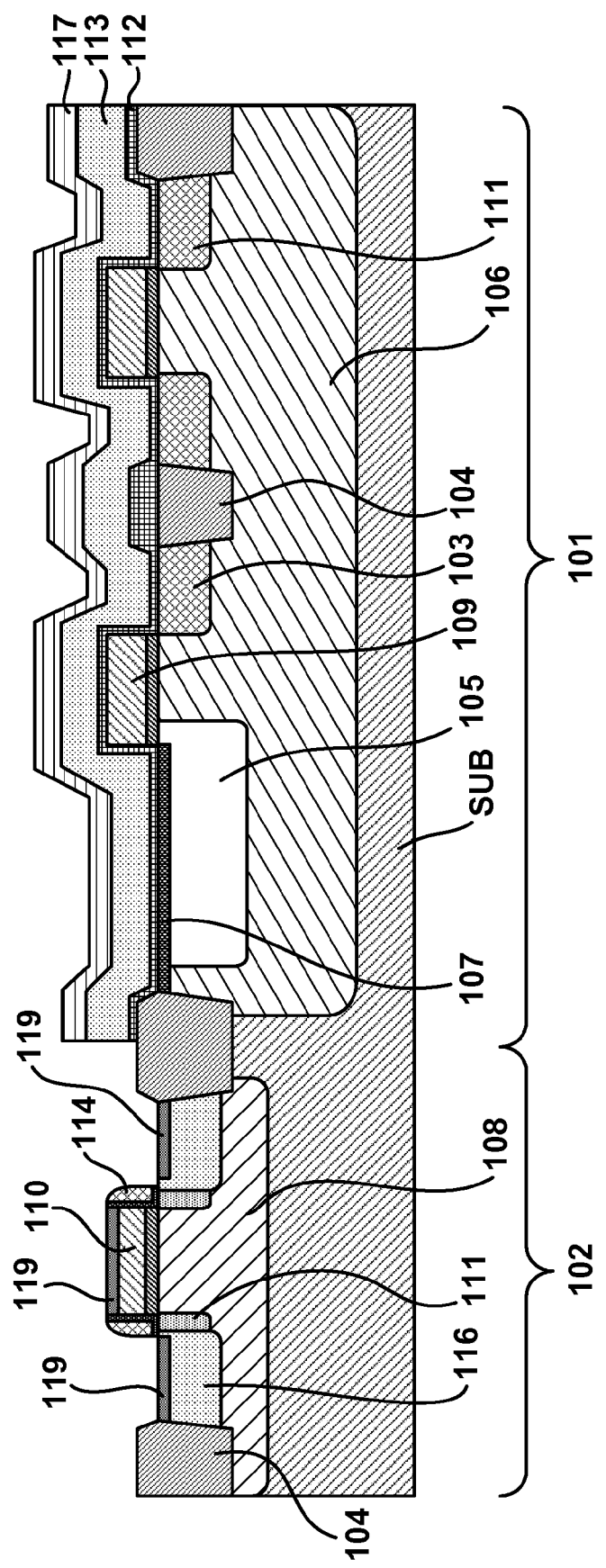
FIG. 8 is a sectional view exemplifying the method for manufacturing the solid state image sensor as the example of the semiconductor device.

The stacked film 118 containing the high melting point metal is annealed. This annealing allows the high melting point metal to react with silicon which forms the gate electrode 110, source region, and drain region of the MOS transistor of the peripheral area 102 (silicidation of the high melting point metal). This makes it possible to form a high melting point metal silicide layer (high melting point metal semiconductor compound layer) 119 on the source region, drain region, and gate electrode of the MOS transistor of the peripheral area 102, as shown in FIG. 8. Examples of the high melting point metal semiconductor compound are titanium silicide, nickel silicide, cobalt silicide, tungsten silicide, molybdenum silicide, tantalum silicide, chromium silicide, palladium silicide, and platinum silicide. During this annealing, since the blocking layer 117 serves as a silicidation blocking layer, no high melting point metal silicide layer is formed in the pixel area 101. The stacked film 118 containing the unreacted high melting point metal is removed by dipping it in an acid solution.

Figure 9:
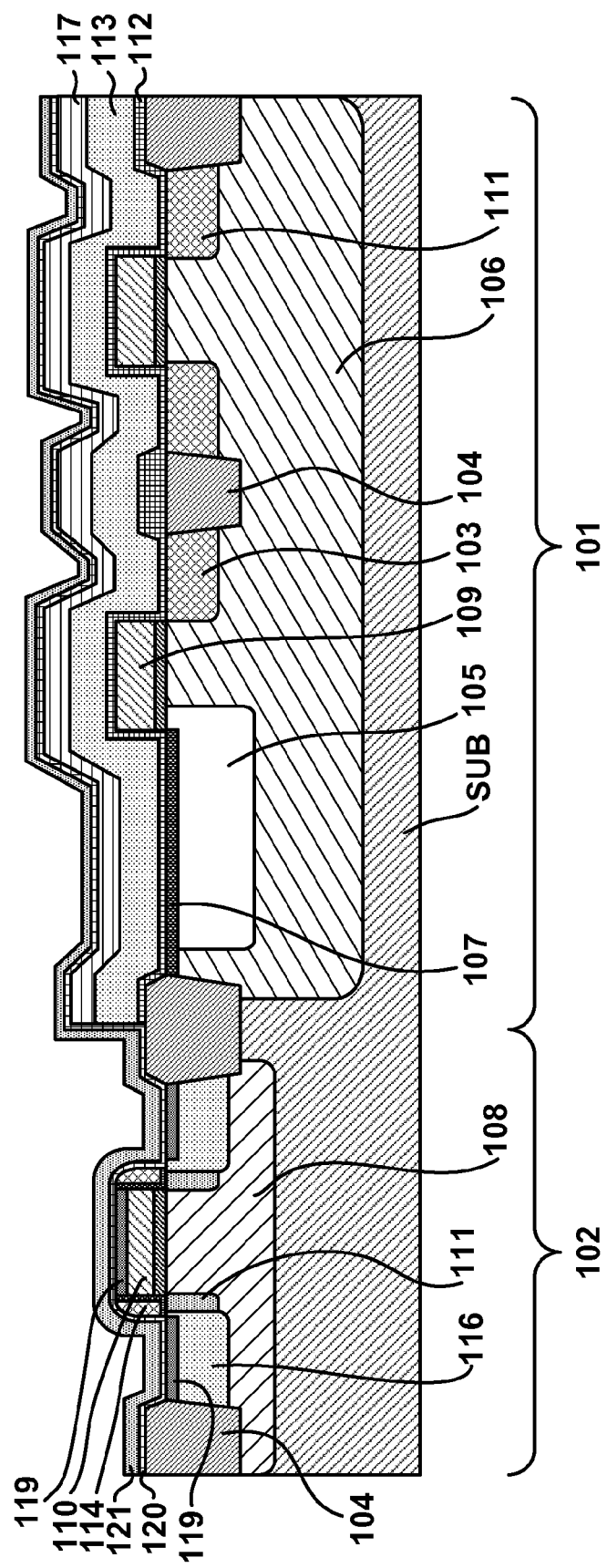
FIG. 9 is a sectional view exemplifying the method for manufacturing the solid state image sensor as the example of the semiconductor device.

As shown in FIG. 9, an insulating film (fourth insulating film) 120 made of a silicon oxide film is formed on both the pixel area 101 and the peripheral area 102. An insulating film (fifth insulating film) 121 made of a silicon nitride film is formed on the insulating film 120. The insulating film 120 is effective to relax the stress generated by the insulating film 121. The insulating film 121 serves as an etching stopper when forming the contact hole in the peripheral area 102.

Figure 10:
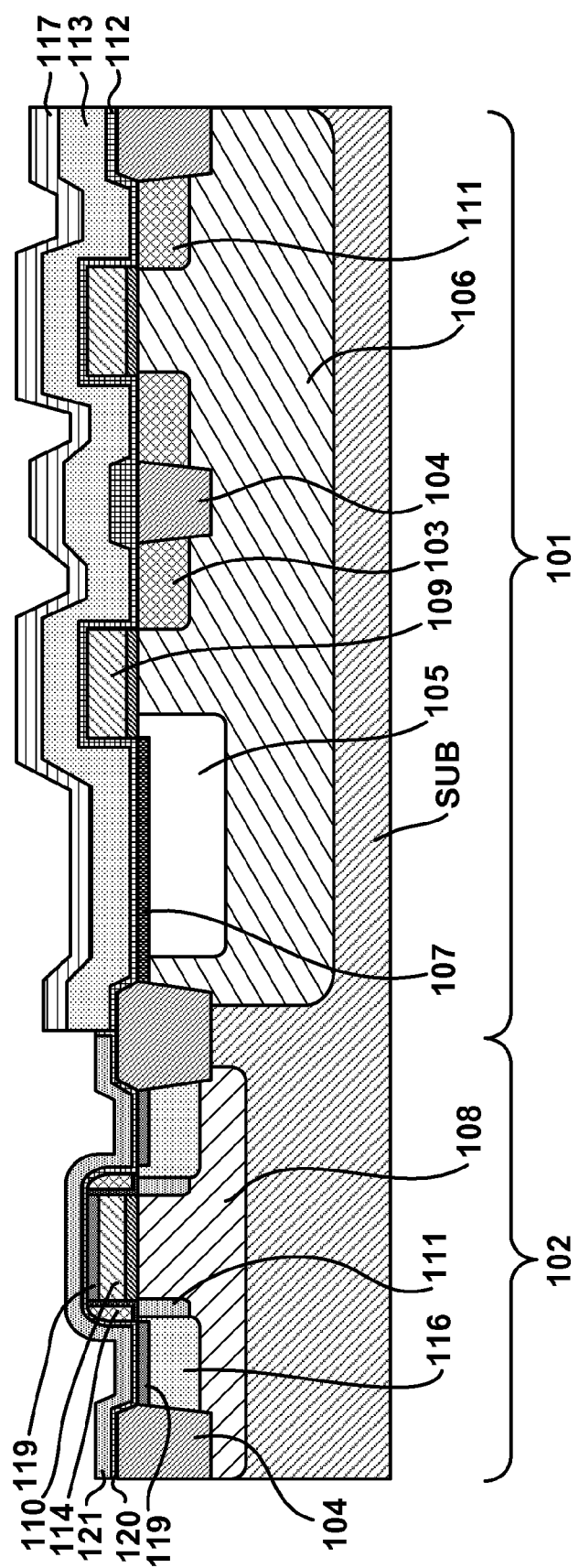
FIG. 10 is a sectional view exemplifying the method for manufacturing the solid state image sensor as the example of the semiconductor device.
Figure 11:
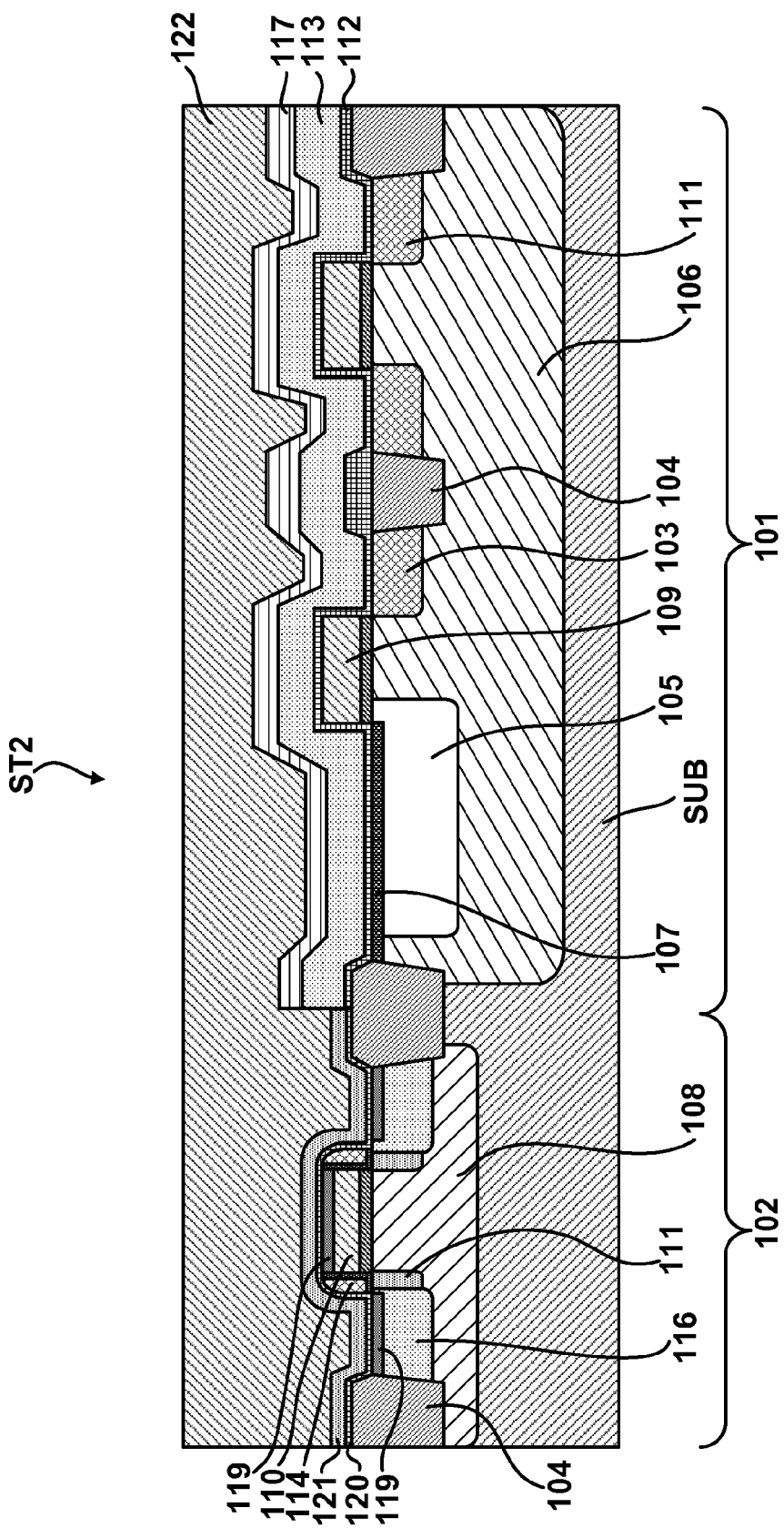
FIG. 11 is a sectional view exemplifying the method for manufacturing the solid state image sensor as the example of the semiconductor device.

As shown in FIG. 10, the insulating films 120 and 121 are selectively removed from the pixel area 101 while the insulating films are left in the peripheral area 102. Subsequently, as shown in FIG. 11, an insulating film 122 made of, for example, a silicon oxide film or a silicon oxide film containing boron or phosphorus is formed. The insulating film 122 serves as an interlayer insulating film. Assume that the insulating film 122 in the pixel area 101 serves as the third insulating film, and the insulating film 122 in the peripheral area 102 serves as the sixth insulating film. The third and sixth insulating films may be formed simultaneously or separately.

A structure ST2 is obtained by the above steps. The structure ST2 includes the semiconductor substrate SUB having the pixel area 101 as the first region and the peripheral area 102 as the second region, and the first to sixth insulating films. The insulating film 112 serving as the first insulating film is arranged on the pixel area 101 serving as the first region. The insulating film 113 serving as the second insulating film is arranged on the insulating film 112. The insulating film 122 serving as the third insulating film is arranged on the insulating film 113. The insulating film 120 serving as the fourth insulating film is arranged on the peripheral area 102 serving as the second region. The insulating film 121 serving as the fifth insulating film is arranged on the insulating film 120. The insulating film 122 serving as the sixth insulating film is arranged on the insulating film 121.

The first, third, fourth, and sixth insulating films have a first composition. In the above example, the first composition indicates the silicon oxide film. The second and fifth insulating films have a second composition different from the first composition. In the above example, the second composition indicates the silicon nitride film. The same composition indicates materials having the same composition formulas and includes different composition ratios and a case in which a small amount of impurity is contained.

The manufacturing method of this embodiment includes a first contact hole forming step of forming first contact holes extending through the first, second, and third insulating films, and a second contact hole forming step of forming second contact holes extending through the fourth, fifth, and sixth insulating films. In the following description, the first contact hole forming step will be described with reference to FIGS.

Figure 16:
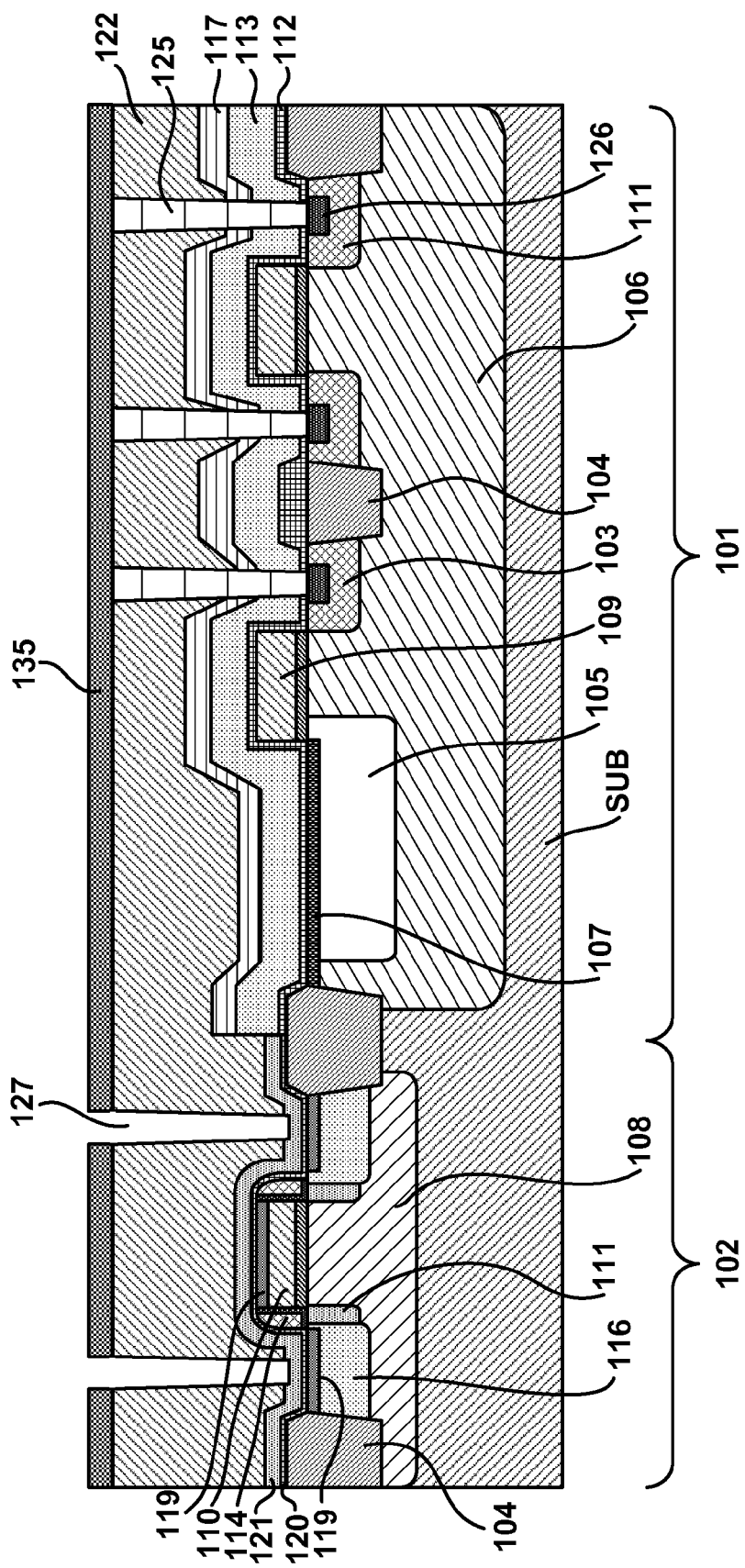
FIG. 16 is a sectional view exemplifying the method for manufacturing the solid state image sensor as the example of the semiconductor device.

12 to 14, while the second contact hole forming step will be described with reference to FIGS. 16 and 17.

The second contact hole forming step is preferably performed after contact plugs 125 are formed (filled) in first contact holes 124-2 formed in the first contact hole forming step. Alternatively, the first contact hole forming step is preferably performed after contact plugs 129 are formed (filled) in second contact holes 128 formed in the second contact hole forming step. Alternatively, the first contact hole forming step is preferably performed in a state wherein the second contact holes formed in the second contact hole forming step are covered with a photoresist pattern. That is, the first contact hole forming step is not performed while the second contact holes formed in the second contact hole forming step are kept exposed. This makes it possible to prevent the bottom portions of the first and second contact holes 124-2 and 128 from being simultaneously exposed. Since the step of forming the first contact holes 124-2 is not performed after forming the second contact holes 128, a possibility of contamination by reaction products in forming the second contact holes 128 can be suppressed. Therefore, the semiconductor compound or its reaction products caused by etching the bottom portions of the second contact holes 128 will not contaminate the floating diffusion 103 and diffusion regions 111 at the bottom portions of the first contact holes 124-2.

Figure 12:
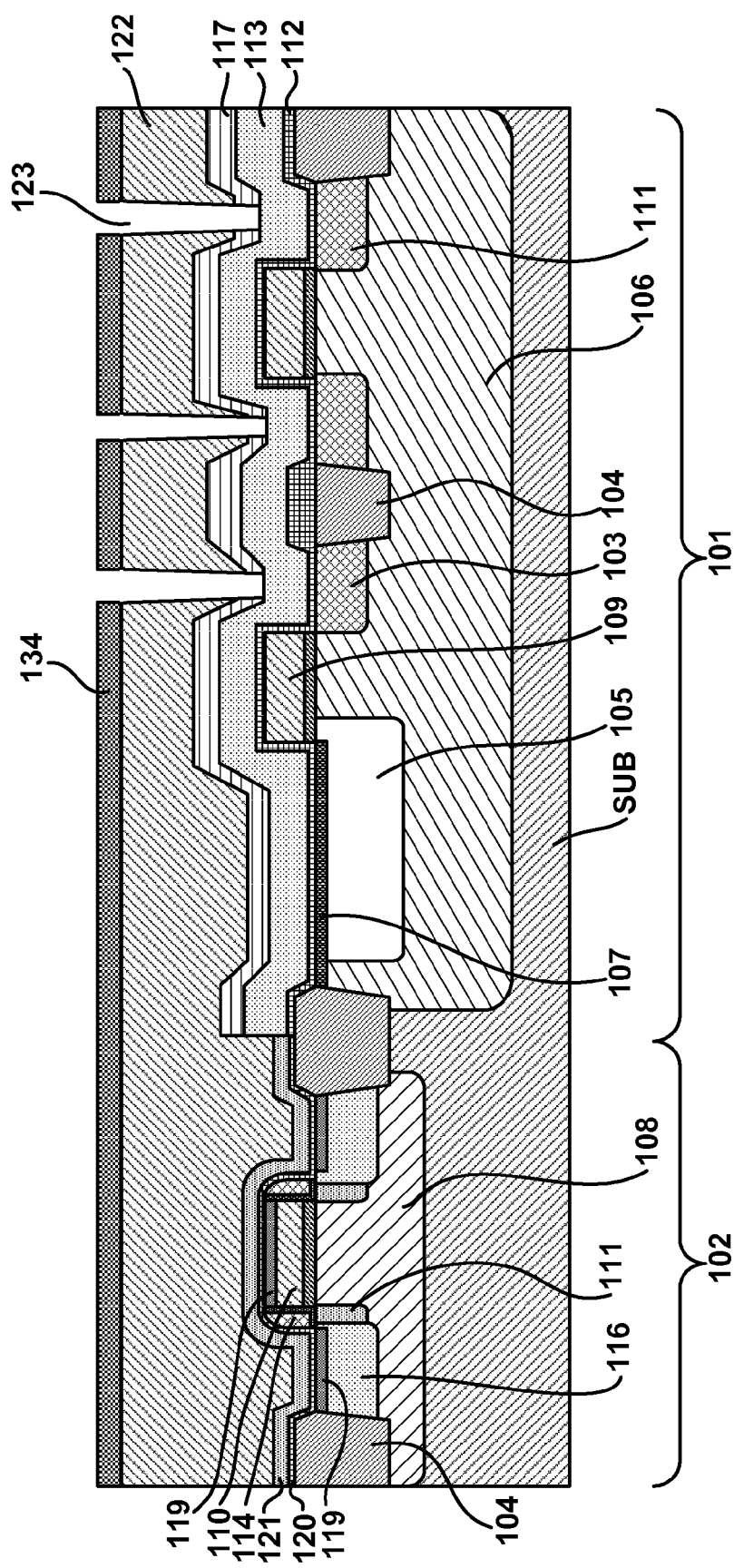
FIG. 12 is a sectional view exemplifying the method for manufacturing the solid state image sensor as the example of the semiconductor device.

The practical manufacturing process will be described with reference to FIGS. 12 to 18. First of all, the first contact hole forming step will be described with reference to FIGS. 12 to 14. As shown in FIG. 12, a first photoresist pattern 134 having openings at the prospective positions of the first contact holes is formed on the insulating film 122. The insulating film 122 serving as the third insulating film is etched to form openings 123 using the insulating film 113 serving as the second insulating film as an etching stopper. When the blocking layer 117 has the same composition as that of the insulating film 113, the blocking layer 117 serves as the etching stopper. In this case, the blocking layer 117 and the insulating film 113 are continuously etched in a subsequent step.

Figure 13:
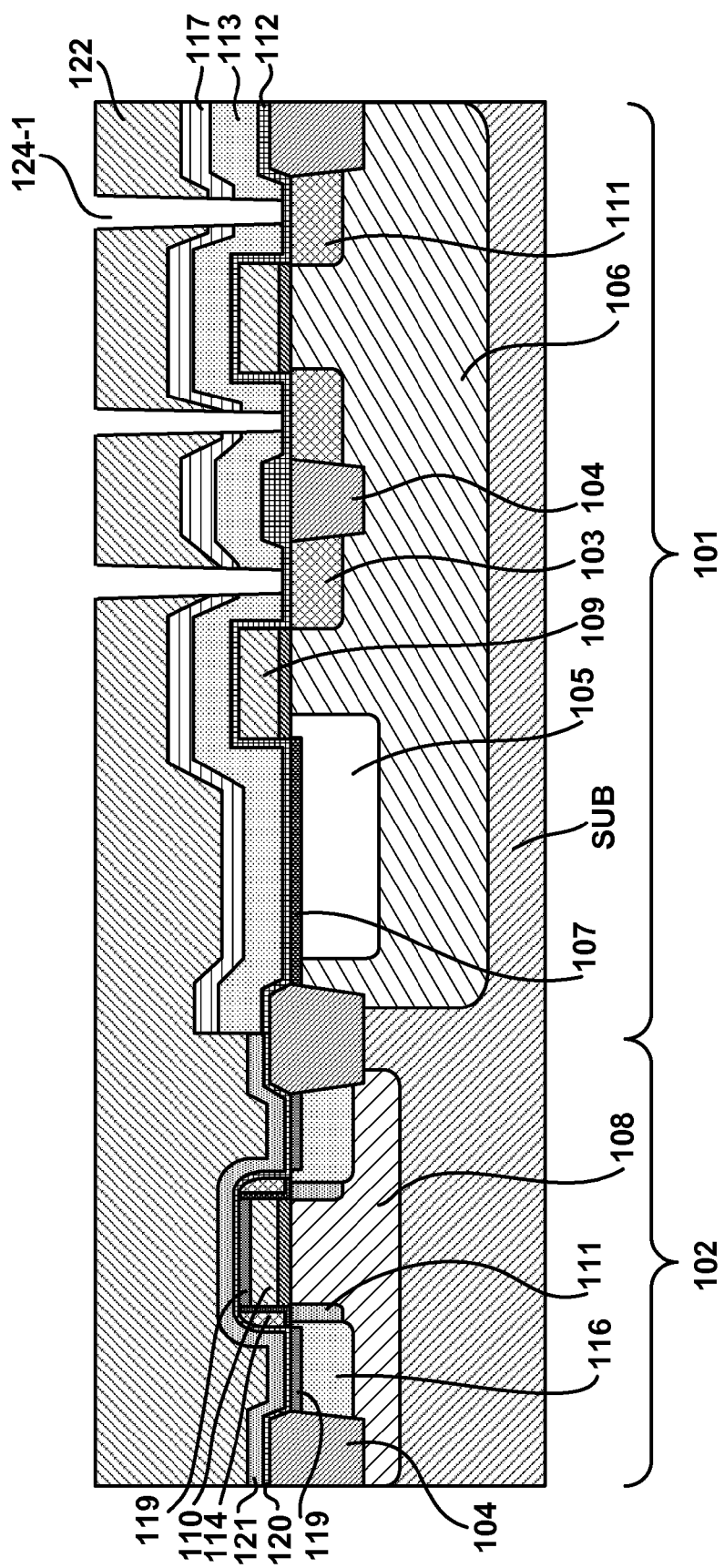
FIG. 13 is a sectional view exemplifying the method for manufacturing the solid state image sensor as the example of the semiconductor device.

As shown in FIG. 13, the insulating film (second insulating film) 113 is etched through the openings 123 to form openings 124-1. This step is performed under the etching conditions wherein the etching rate of the insulating film (second insulating film) 113 is much higher than that of the insulating film (first insulating film) 112 (that is, the etching selectivity is sufficiently high).

Figure 14:
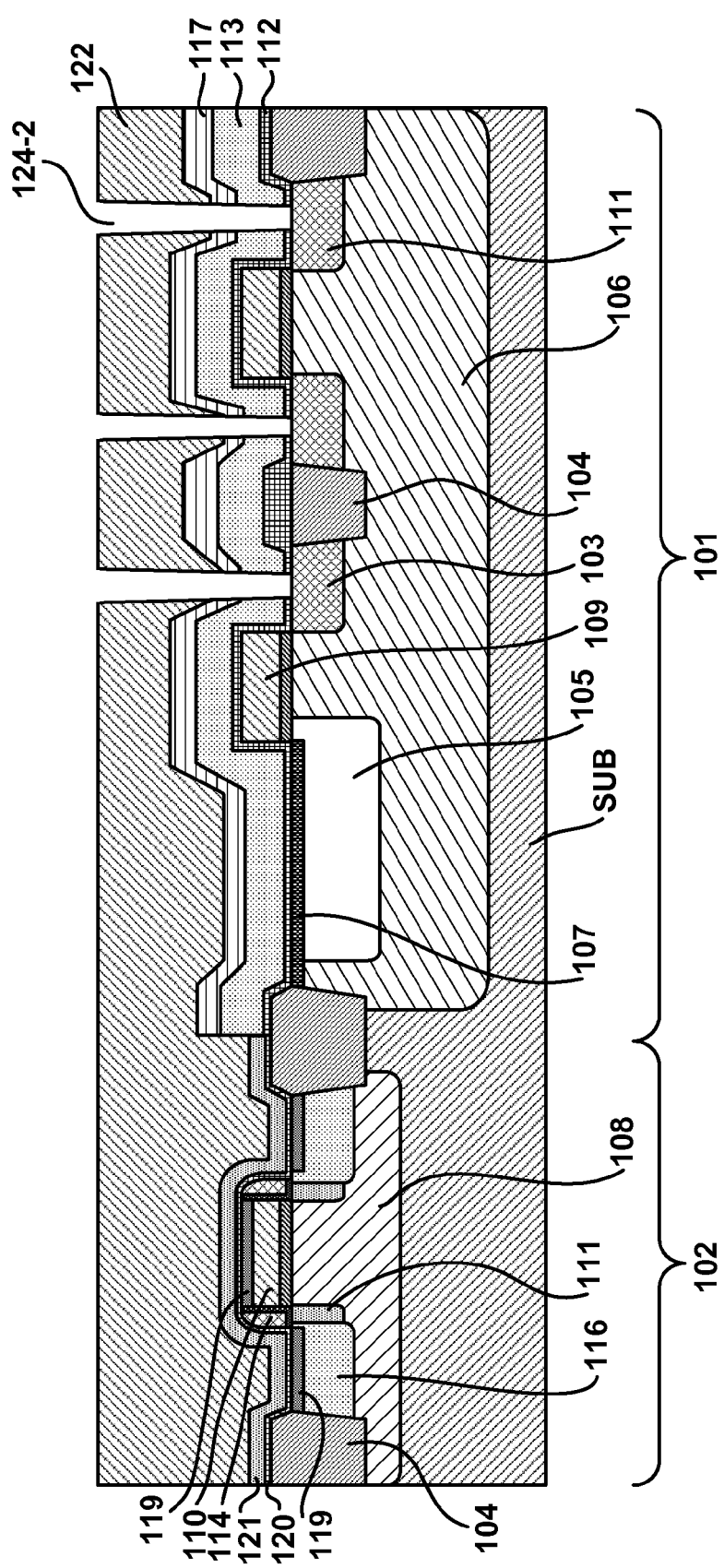
FIG. 14 is a sectional view exemplifying the method for manufacturing the solid state image sensor as the example of the semiconductor device.

As shown in FIG. 14, the insulating film (first insulating film) 112 is etched through the openings 124-1, thereby forming the first contact holes 124-2. This step is performed under the etching conditions wherein the etching rate of the insulating film (first insulating film) 112 is much higher than that of the floating diffusion 103 and the diffusion regions 111 formed in the semiconductor substrate SUB (that is, the etching selectivity is sufficiently high). That is, when forming the first contact holes 124-2 in the pixel area 101, the insulating film (second insulating film) 113 and the insulating film (first insulating film) 112 are etched under different etching conditions. This can prevent the floating diffusion 103 and the diffusion regions 111 formed in the semiconductor substrate SUB from being excessively etched. Therefore, this makes it possible to prevent a disadvantage, for example, an increase in leakage current upon etching the floating diffusion 103 and the diffusion regions 111.

The etching conditions will now be described in detail below. Assume that the insulating film (second insulating film) 113 is made of a silicon nitride film, the insulating film (first insulating film) 112 is made of a silicon oxide film, and the semiconductor substrate SUB is made of a silicon substrate. In this case, a gas mixture containing $CH_2F_2$ or $CF_4$ as a main component is preferably used as an etching gas when etching the insulating film (second insulating film) 113. A gas mixture containing $CH_4F_8$ or $C_4F_6$ as a main component is preferably used as an etching gas when etching the insulating film (first insulating film) 112.

Let R1 be the etching rate of silicon (material of the semiconductor substrate SUB) under the etching conditions for etching the insulating film 112 and R2 be the etching rate of silicon under the etching conditions for etching the insulating film 113. In this case, R1<R2 must hold. This makes it possible to prevent the floating diffusion 103 and the diffusion regions 111 formed in the semiconductor substrate SUB from being excessively etched. The etching rate of silicon under the etching conditions effective for etching both the insulating film (second insulating film) 113 and the insulating film (first insulating film) 112 is generally higher than R1.

The first photoresist pattern 134 is preferably removed at the end of forming the openings 123 in the insulating film 122, that is, before etching the insulating film (second insulating film) 113 and the insulating film (first insulating film) 112. This is because when the insulating films 113 and 112 are etched while the photoresist pattern 134 remains, the volatile materials of the photoresist pattern 134 and its reaction products may contaminate the floating diffusion 103 and the diffusion regions 111.

Figure 15:
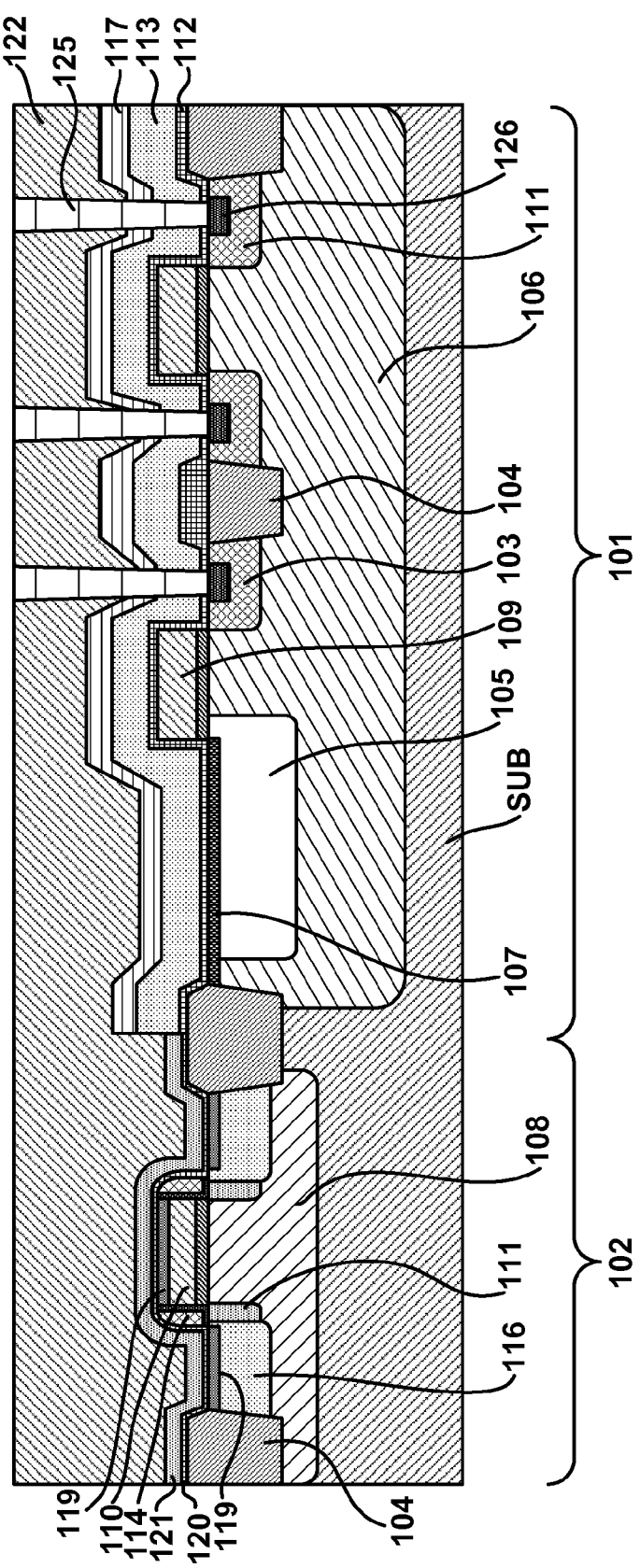
FIG. 15 is a sectional view exemplifying the method for manufacturing the solid state image sensor as the example of the semiconductor device.

After forming the first contact holes 124-2, as shown in FIG. 15, a single- or multi-layered metal film is deposited by CVD, and an excessive metal film is removed by CMP, thereby forming the contact plugs 125. Before forming the contact plugs 125, the contact holes 124-2 may be cleaned with a cleaning solution. Alternatively, before forming the contact plugs 125, an impurity is doped into the semiconductor substrate SUB through the contact holes 124-2 to form impurity regions 126, thereby stabilizing the contact resistance.

The second contact hole forming step will be described with reference to FIGS. 16 and 17. As shown in FIG. 16, a second photoresist pattern 135 having openings at the prospective positions of the second contact holes is formed on the insulating film 122. The insulating film 122 serving as the sixth insulating film is etched using the insulating film 121 serving as the fifth insulating film as the etching stopper, thereby forming openings 127.

Figure 17:
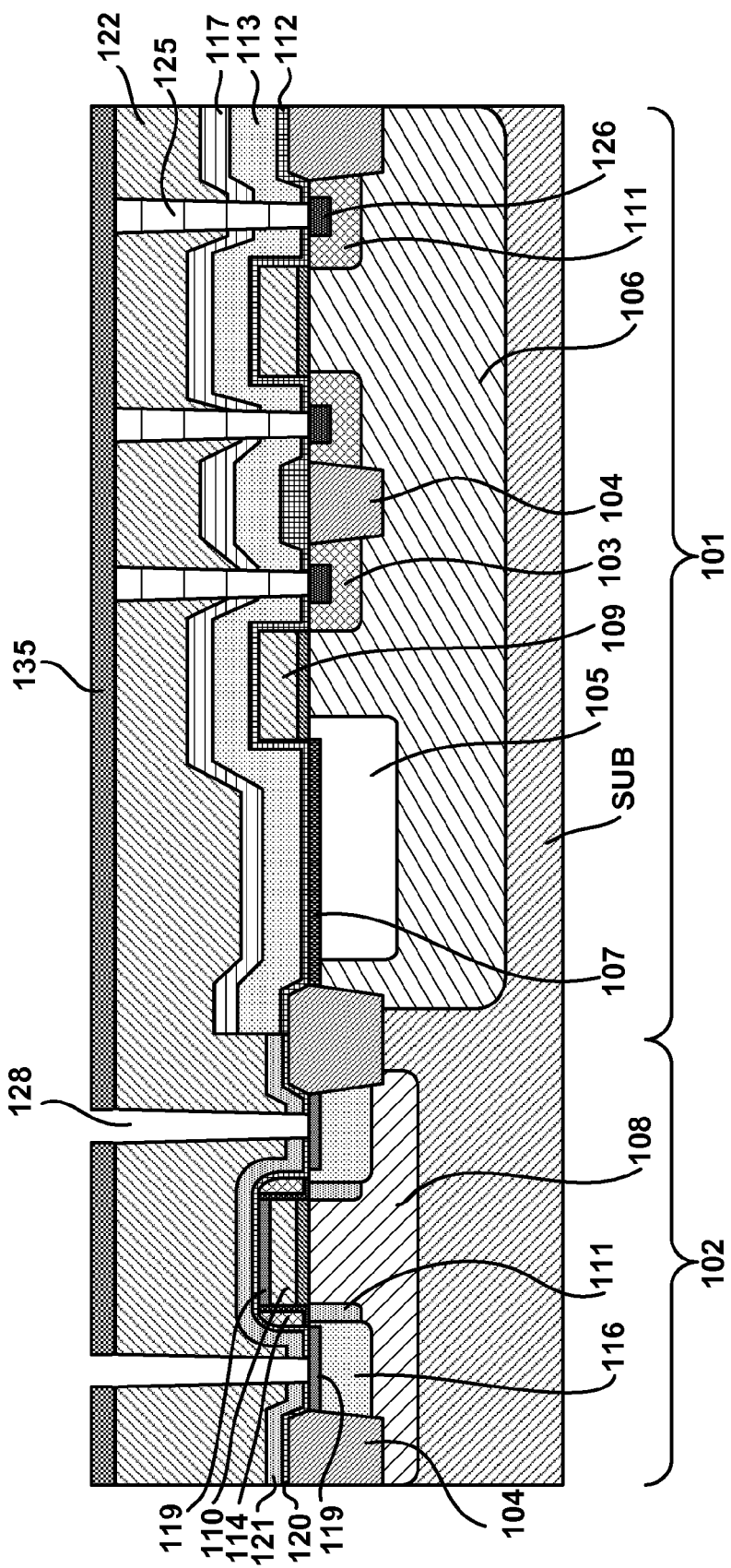
FIG. 17 is a sectional view exemplifying the method for manufacturing the solid state image sensor as the example of the semiconductor device.

As shown in FIG. 17, the insulating film (fifth insulating film) 121 and the insulating film (fourth insulating film) 120 are continuously etched through the openings 127 under the same etching conditions, thereby forming second contact holes 128. The step of forming the second contact holes 128 in the peripheral area 102 can shorten the processing time as compared with the step of forming the first contact holes 124-2 in the pixel area 101 (the insulating film (second insulating film) 113 and the insulating film (first insulating film) 112 are etched under different etching conditions).

The second photoresist pattern 135 is preferably removed at the end of forming the openings 127 in the insulating film 122, that is, before etching the insulating film (fifth insulating film) 121 and the insulating film (fourth insulating film) 120. This is because when the insulating film 121 and the insulating film 120 are etched while the second photoresist pattern 135 remains, the volatile materials from the photoresist pattern 135 and its reaction products may contaminate the silicide layer 119. Continuous etching of the insulating film 121 and the insulating film 120 under the same conditions is more advantageous in a case wherein the second photoresist pattern 135 is removed before etching the insulating film 121 and the insulating film 120. As described above, this is because the insulating film 120 serving as the fourth insulating film and the insulating film 122 serving as the sixth insulating film have the same composition. That is, when the insulating film 120 is etched under the etching conditions wherein the insulating film 120 has a high etching rate, the insulating film 122 is also etched in a large amount. Under the etching conditions wherein both the insulating film 120 and the insulating film 121 can be etched, the etching rate of the insulating film 120 is generally low, and hence the etching rate of the insulating film 122 is also low. As in this embodiment, when the silicide layer or metal layer is exposed through the contact holes 128, it is desirable that the contact hole 128 is not cleaned with a cleaning solution because the silicide layer and the like are damaged by the cleaning solution. Dry etching such as sputter etching is performed for the contact holes 128. This makes it possible to remove the scattered substances in contact hole formation.

As shown in FIG. 18, a single- or multi-layered metal film is deposited by CVD, and an excessive metal film is moved by CMP, thereby forming contact plugs 129. Finally, an interconnection pattern 130 made of a metal such as aluminum or copper is formed on the pixel area 101 and the peripheral area 102. An insulating film 131, a via plug 132, an interconnection pattern 133, a microlens 136 are formed. A color filter may be formed, as needed. The solid state image sensor 100 is finished by the above process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-223456, filed Oct. 7, 2011 which is hereby incorporated by reference herein in its entirety.

What is claimed is:

1. A method for manufacturing a semiconductor device, the method comprising
    preparing a structure including a semiconductor substrate having a first region and a second region, a first insulating film arranged on the first region of the semiconductor substrate, a second insulating film arranged on the first insulating film, a third insulating film arranged on the second insulating film, a fourth insulating film arranged on the second region of the semiconductor substrate, a fifth insulating film arranged on the fourth insulating film, and a sixth insulating film arranged on the fifth insulating film;
    forming first contact holes extending through the first insulating film, the second insulating film, and the third insulating film; and
    forming second contact holes extending through the fourth insulating film, the fifth insulating film, and the sixth insulating film,
    wherein the first insulating film, the third insulating film, the fourth insulating film, and the sixth insulating film have a first composition, and the second insulating film and the fifth insulating film have a second composition different from the first composition,
    the forming the first contact holes comprises etching the third insulating film using the second insulating film as an etching stopper, etching the second insulating film, and then etching the first insulating film under an etching condition different from an etching condition for the second insulating film, and
    the forming the second contact holes comprises etching the sixth insulating film using the fifth insulating film as an etching stopper, and then continuously etching the fifth insulating film and the fourth insulating film under the same etching condition for the fifth insulating film and the fourth insulating film.

2. The method according to claim 1, wherein the forming the second contact holes is performed after forming contact plugs in the first contact holes.

3. The method according to claim 1, wherein the forming the first contact holes is performed after forming contact plugs in the second contact holes.

4. The method according to claim 1, wherein the first insulating film, the third insulating film, the fourth insulating film, and the sixth insulating film comprise silicon oxide films, and the second insulating film and the fifth insulating film comprise silicon nitride films, respectively.

5. The method according to claim 1, wherein the forming the first contact holes comprises:
    etching the third insulating film using a first photoresist pattern formed on the third insulating film to form openings in the third insulating film;
    removing the first photoresist pattern after the etching the third insulating film; and
    etching the second insulating film and the first insulating film under different etching conditions through the openings formed in the third insulating film after the removing the first photoresist pattern.

6. The method according to claim 1, wherein the forming the second contact holes comprises:
    etching the sixth insulating film using a second photoresist pattern formed on the sixth insulating film to form openings in the sixth insulating film;
    removing the second photoresist pattern after the etching the sixth insulating film; and
    etching the fifth insulating film and the fourth insulating film under the same etching condition for the fifth insulating film and the fourth insulating film, through the openings formed in the sixth insulating film after the removing the second photoresist pattern.

7. The method according to claim 1, wherein the forming the second contact holes comprises forming the second contact holes so as to expose one of a metal silicide and a metal.

8. The method according to claim 1, wherein the semiconductor device includes a solid state image sensor, and
    the first region includes a pixel area having pixels each including a photoelectric converter, and the second region includes a peripheral area which reads out signals from the pixels.

9. A method for manufacturing a solid state image sensor, the method comprising:
    preparing a structure including a semiconductor substrate having a pixel area having pixels each including a photoelectric converter and a peripheral area including a circuit containing a silicide layer to read out signals from the pixels, a first insulating film arranged on the pixel area of the semiconductor substrate, a second insulating film arranged on the first insulating film, a third insulating film arranged on the second insulating film, a fourth insulating film arranged on the peripheral area of the semiconductor substrate, a fifth insulating film arranged on the fourth insulating film, and a sixth insulating film arranged on the fifth insulating film;
    forming first contact holes extending through the first insulating film, the second insulating film, and the third insulating film; and
    forming second contact holes extending through the fourth insulating film, the fifth insulating film, and the sixth insulating film, wherein the first insulating film, the third insulating film, the fourth insulating film, and sixth insulating film have a first composition, and the second insulating film and the fifth insulating film have a second composition different from the first composition, the forming the first contact holes comprises etching the third insulating film using the second insulating film as an etching stopper, etching the second insulating film, and then etching the first insulating film under an etching condition different from an etching condition for the second insulating film, and the forming the second contact holes comprises etching the sixth insulating film using the fifth insulating film as an etching stopper, and then continuously etching the fifth insulating film and the fourth insulating film under the same etching condition for the fifth insulating film and the fourth insulating film.

10. The method according to claim 9, wherein the forming the second contact holes is performed after forming contact plugs in the first contact holes.

11. The method according to claim 9, wherein the forming the first contact holes is performed after forming contact plugs in the second contact holes.

12. The method according to claim 9, wherein the first insulating film, the third insulating film, the fourth insulating film, and the sixth insulating film comprise silicon oxide films, and the second insulating film and the fifth insulating film comprise silicon nitride films, respectively.

* * * * *